a12) United States Patent
Ruby et al.

(10) Patent No.: US 8,230,158 B2
(45) Date of Patent: Jul. 24, 2012

(54) MEMORY DEVICES AND METHODS OF STORING DATA ON A MEMORY DEVICE

(75) Inventors: Paul Ruby, Folsom, CA (US); Neal Mielke, Los Altos Hills, CA (US)

(73) Assignee: Micron Technology, Inc., Boise, ID (US)

( * ) Notice: Subject to any disclaimer, the term of this patent is extended or adjusted under 35 U.S.C. 154(b) by 434 days.

(21) Appl. No.: 12/190,482

(22) Filed: Aug. 12, 2008

(65) Prior Publication Data

US 2010/0039860 A1    Feb. 18, 2010

(51) Int. Cl.
G06F 12/00    (2006.01)
(52) U.S. Cl. ......... 711/103; 711/100; 711/154; 711/159
(58) Field of Classification Search .................. 711/103, 711/100, 154, 159
See application file for complete search history.

(56) References Cited

U.S. PATENT DOCUMENTS

| 6,735,697 | B1 | 5/2004 | Buhr |
| 2002/0159285 | A1 | 10/2002 | Morley et al. |
| 2005/0008150 | A1 | 1/2005 | Liang |
| 2005/0207206 | A1 | 9/2005 | Coulson et al. |
| 2007/0217608 | A1 | 9/2007 | Shimasaki |
| 2008/0151618 | A1 | 6/2008 | Sharon et al. |
| 2008/0170685 | A1 | 7/2008 | Flake et al. |
| 2009/0013233 | A1 | 1/2009 | Radke |
| 2009/0013234 | A1 | 1/2009 | Radke |

FOREIGN PATENT DOCUMENTS

EP    1684308    7/2006

OTHER PUBLICATIONS

International Search Report received in International Application No. PCT/US2009/051726, dated Feb. 23, 2010.
U.S. Appl. No. 11/943,943, filed Nov. 21, 2007, Radke.
U.S. Appl. No. 11/944,023, filed Nov. 21, 2007, Radke.
Extended European Search Report of Sep. 22, 2011 in European Patent Application No. 09807049.3, corresponding to PCT/US2009/051726.

*Primary Examiner* — Midys Rojas
(74) *Attorney, Agent, or Firm* — Knobbe, Martens, Olson & Bear LLP (57) ABSTRACT

Apparatus and methods are disclosed, such as those involving a flash memory device. One such apparatus includes a memory block including a plurality of memory cells; and a data randomizer configured to randomly or pseudo-randomly change original data to be stored in the memory block to changed data. The original data is changed such that a pattern of data as stored in the memory block is different than what it would have been if the original data had been stored in the memory block during a write operation. This configuration can reduce or eliminate data pattern-dependent errors in data digits stored in memory cells.

20 Claims, 9 Drawing Sheets

|  | | BL0 | BL1 | BL2 | BL3 | BL4 | ••• | BLm |
|---|---|---|---|---|---|---|---|---|
|  | ADDRESS | 0000 | 0001 | 0010 | 0011 | 0100 | ••• | XXXX |
|  | RB | 0 | 1 | 1 | 0 | 0 | ••• | 1 |
| WRITE | DW | 1 | 1 | 1 | 1 | 1 | ••• | 1 |
|  | DIN | 1 | 0 | 0 | 1 | 1 | ••• | 0 |
| READ | DOUT | 1 | 0 | 0 | 1 | 1 | ••• | 0 |
|  | DR | 1 | 1 | 1 | 1 | 1 | ••• | 1 |

*FIG. 6B*

MEMORY DEVICES AND METHODS OF STORING DATA ON A MEMORY DEVICE

BACKGROUND

1. Field of the Invention

Embodiments of the invention relate to memory devices, and more particularly, in one or more embodiments, to flash memory devices.

2. Description of the Related Art

Flash memory devices are non-volatile memory devices which store information on a semiconductor in a way that needs no power to maintain the information stored therein. Flash memory devices have been widely used as mass-storage devices because of their high storage densities and low costs.

Figure 1:
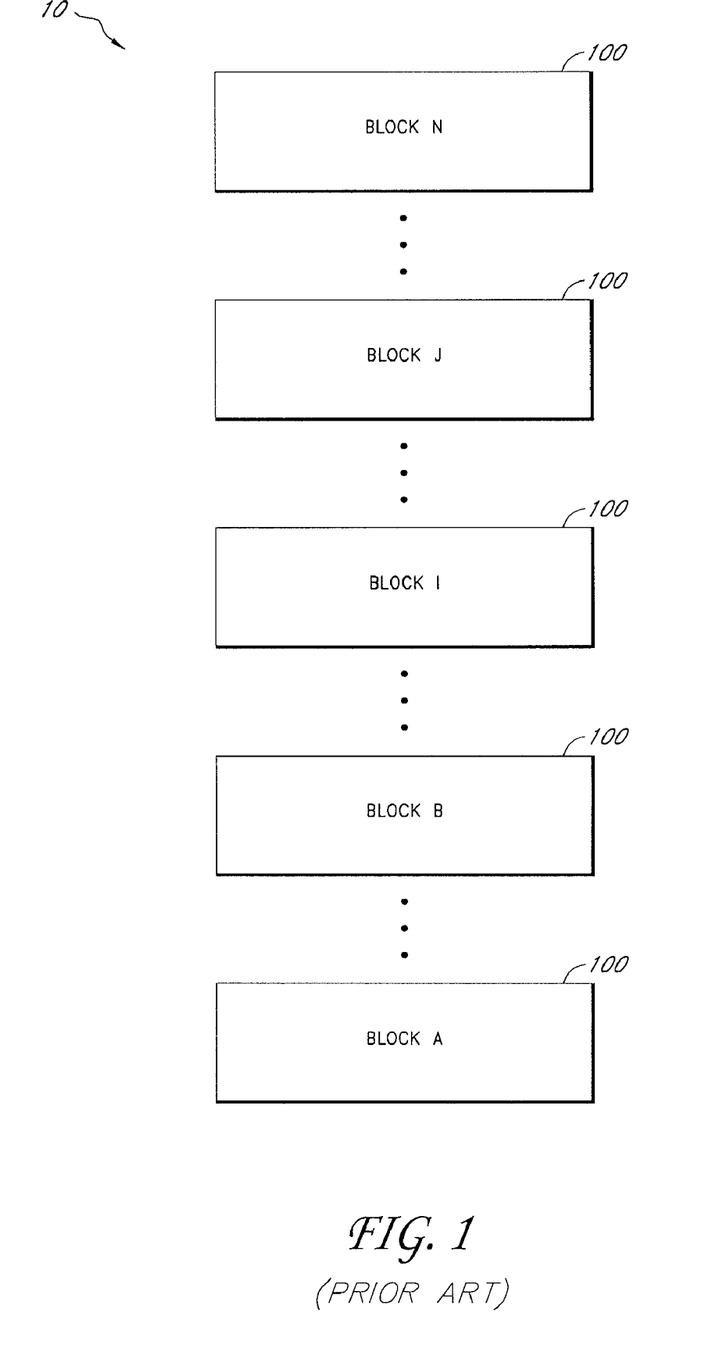
FIG. 1 is a schematic diagram of a conventional NAND flash memory device including a plurality of memory blocks.

Referring to FIG. 1, a conventional NAND flash memory device is arranged in a plurality of memory blocks. The plurality of memory blocks 10 includes first to N-th memory blocks 100. Each of the memory blocks 100 includes a plurality of memory cells typically arranged in a matrix form.

Figure 2A:
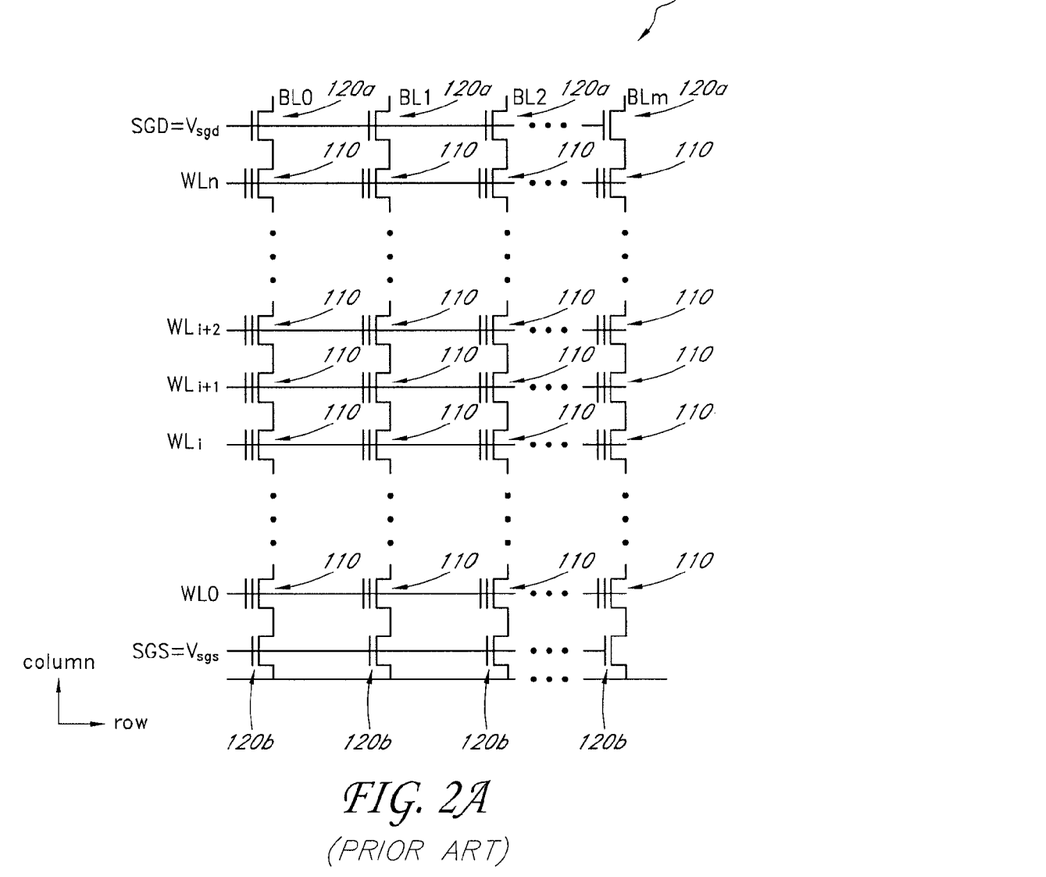
FIG. 2A is a schematic diagram of a memory block of a conventional NAND flash memory device.

FIG. 2A illustrates a memory block 100. The illustrated memory block 100 includes first to m-th bit lines BL0-BLm and first to n-th word lines WL0-WLn. In some arrangements, m can be 32,767 or 65,535, and n can be 32 or 64. The bit lines BL0-BLm extend parallel to one another in a column direction. The word lines WL0-WLn extend parallel to one another in a row direction perpendicular to the column direction. The memory block 100 also includes upper and lower bit line select transistors 120a, 120b for selecting one or more bit lines in the memory block 100.

Each bit line includes a string of memory cells 110. For example, the second bit line BL1 includes memory cells 110 connected in series. Each of the memory cells 110 includes a floating gate transistor. The floating gate transistors of a bit line are coupled to one another in series from source to drain. The control gates of the floating gate transistors of memory cells 110 of a common row are coupled to the same word line. Each of the memory cells 110 stores a charge (or a lack of charge). The amount of stored charge can be used to represent, for example, one or more states, which can represent one or more digits (for example, bits) of data. The charge stored in the floating gate transistor sets the threshold voltage of the floating gate transistor. The memory cells 110 can be either a single-level cell (SLC) or a multi-level cell (MLC). In one arrangement, the amounts of charge stored in the memory cells 110 may be detected by sensing currents flowing through the floating gate transistors of the memory cells 110. In another arrangement, the amounts of charge stored in the memory cells 110 may be detected by sensing the threshold voltage values of the floating gate transistors of the memory cells 110.

Figure 2B:
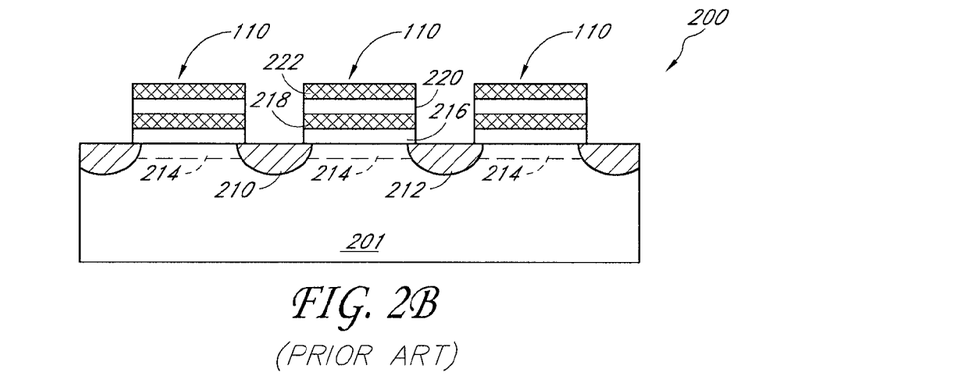
FIG. 2B is a schematic cross-section of the memory block of FIG. 2A.

FIG. 2B illustrates a cross-section of the floating gate transistors of the memory cells 110 in the second bit line BL1. The floating gate transistors are formed on a substrate 201. Each of the floating gate transistors includes a source region 210 (which can be a drain region for a neighboring transistor of the same bit line), a drain region 212 (which can be a source region for a neighboring transistor of the same bit line), a doped channel region 214, a first dielectric 216 (for example, a tunnel oxide), a floating gate 218, a second dielectric 220 (for example, a gate oxide, wherein the tunnel and gate oxide can be formed of the same or different material), and a control gate 222. The first dielectric 216 is formed on the channel region 214 to insulate the floating gate 218 from the channel region 214. The second dielectric 220 physically and electrically separates the floating gate 218 from the control gate 222. The control gate 222 is coupled to an appropriate word line, for example, word line WL1. Electrons can be trapped on the floating gate 218 and be used to store data.

Figure 2C:
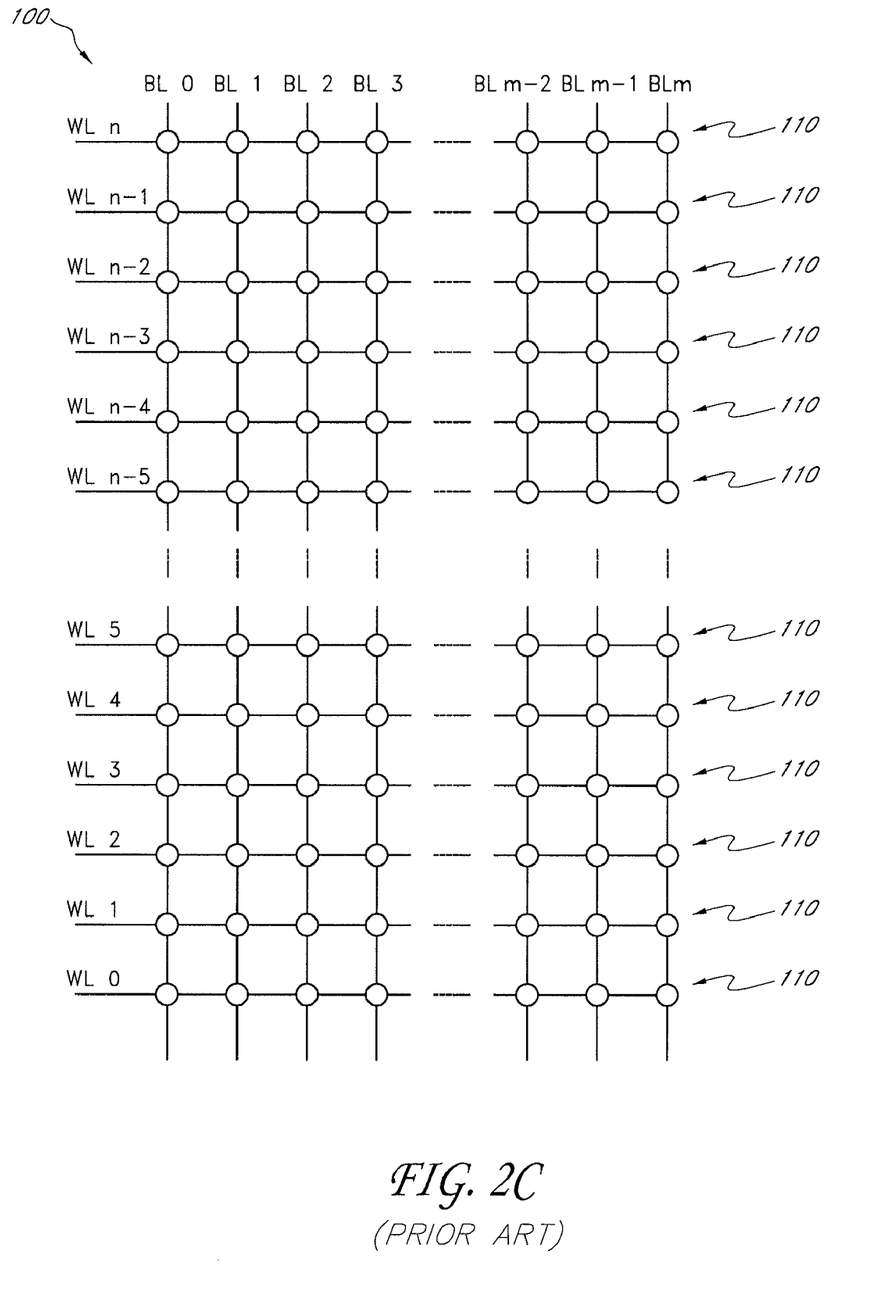
FIG. 2C is a schematic diagram illustrating a conventional method of storing data on a block of a NAND flash memory device.

Referring now to FIG. 2C, a conventional method of writing data on a memory block will be described. FIG. 2C schematically illustrates the memory block 100 of FIG. 2A, and only shows memory cells 110, bit lines BL0-BLm, and word lines WL0-WLn. However, it will be understood that the memory block 100 can include other components as described earlier in connection with FIGS. 2A and 2B.

During a write operation, data is typically written on a set of memory cells coupled to a single word line. Such a set of memory cells can be referred to as a "page." In one arrangement, a page may include all memory cells sharing a word line. In other arrangements, a page may be formed by every two memory cells coupled to a single word line. In certain arrangements, a page may be formed by every four memory cells coupled to a single word line. It will be understood that a page may be formed by any suitable selected number of memory cells coupled to a word line.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

As the geometry of a flash memory device is reduced, distances between cells in the memory device are also reduced. In such a flash memory device, charges stored in neighboring memory cells may cause interference between the memory cells. For example, coupling can occur between the floating gates of neighboring memory cells, which can be referred to as floating-gate coupling in the context of this document.

Certain repeating data patterns may produce more severe floating-gate coupling between neighboring memory cells than random data patterns. An example of a repeating data pattern stored in a single level cell (SLC) flash memory device will now be described in connection with FIGS. 3A and 3B.

Figure 3A:
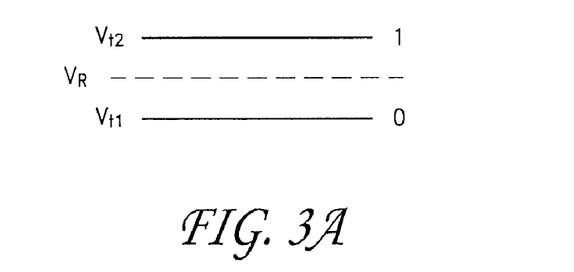
FIG. 3A is a diagram illustrating example threshold levels of a single-level memory cell.

A single-level cell flash memory device stores one of two states in each memory cell to represent a data bit, as shown in FIG. 3A. For example, a data bit "0" is represented by a first threshold voltage $V_{t1}$ that is lower than a reference voltage $V_R$, and a data bit "1" is represented by a second threshold voltage $V_{t2}$ that is higher than the reference voltage $V_R$. All the memory cells of a memory block have one of the two states, for example, representing a data bit "1" in erased state. When writing data bits on the memory cells of the memory block, the threshold voltages of the memory cells either stay the same or change, thereby having either the first or second threshold voltage $V_{t1}$ or $V_{t2}$, depending on the values of the data bits. When reading data bits from the memory cells, it is determined if the threshold voltages of the memory cells are above or below the reference voltage $V_R$.

Figure 3B:
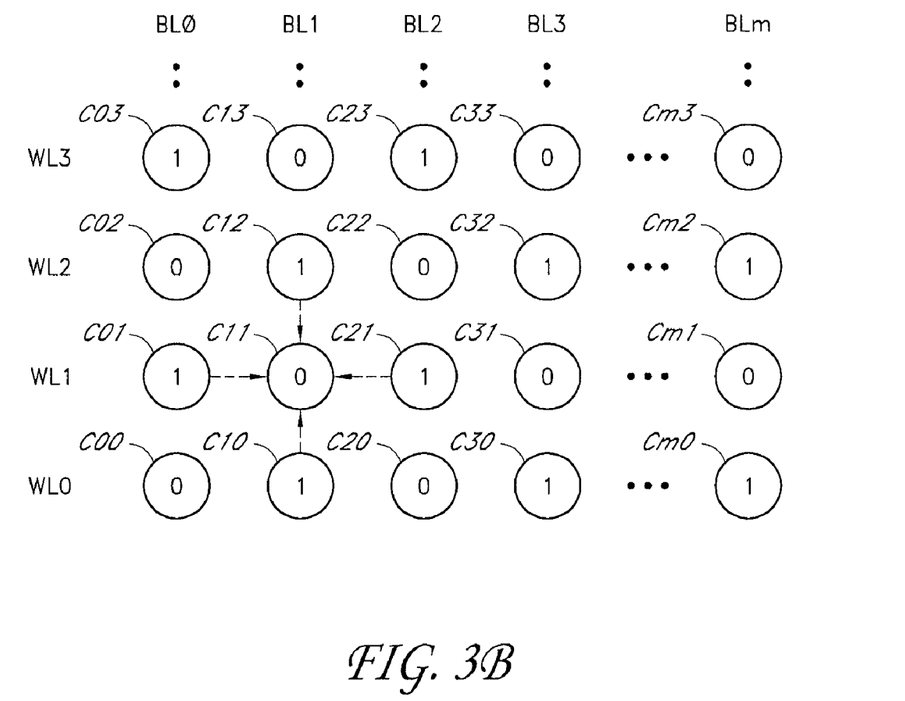
FIG. 3B is a schematic diagram illustrating an example data pattern that can cause errors in memory cells.

FIG. 3B illustrates an example of a repeating data pattern for a single-level cell flash memory device. Circles represent memory cells, and numbers in the circles indicate a value of a data bit stored in the memory cells. The memory cells are arranged in a matrix form. Memory cells of a "row" are those memory cells coupled to an access line, such as a word line WL0-WLn, and memory cells of a "column" are those memory cells coupled to a data line, such as bit line BL0-BLm.

A data pattern shown in FIG. 3B has a repeating pattern of 0, 1, 0, 1, 0, . . . , 1 in both the word line direction and the bit line direction. Such a data pattern may be referred to as a checker board pattern. A checker board pattern can be written on at least a portion of a memory block. Memory cells having data of a checker board pattern are more likely to be subjected to floating-gate coupling.

For example, a memory cell C11 stores a data digit "0" while memory cells C01, C12, C21, C10 neighboring the memory cell C11 store a data digit "1." Charges stored in the neighboring memory cells C01, C12, C21, C10 may couple with a charge stored in the memory cell C11. Because all of the neighboring memory cells C01, C12, C21, C10 have charges that are the same as one another, but different from the charge stored in the memory cell C11, the neighboring memory cells C01, C12, C21, C10 may affect the threshold voltage of the memory cell C11 in a concerted manner, thereby changing the data bit stored in the memory cell C11. Thus, memory cells are more likely to fail when the checker board pattern is written thereon than when a random pattern is written thereon. A skilled artisan will appreciate that there are various other data patterns that can cause such interference between memory cells.

Figure 4A:
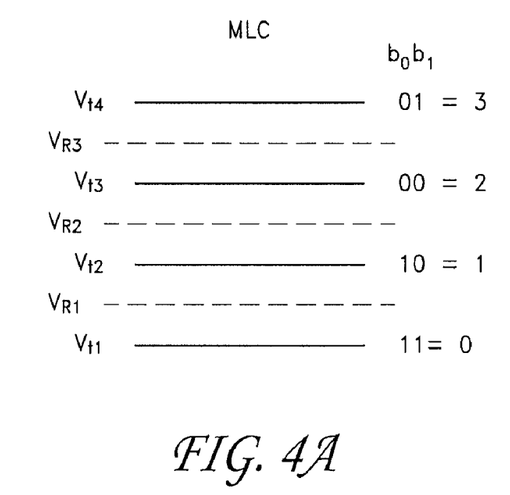
FIG. 4A is a diagram illustrating example threshold levels of a multi-level memory cell.

Referring to FIGS. 4A-4D, an example of a repeating data pattern in a multi-level cell (MLC) flash memory device will be described below. The illustrated multi-level cell (MLC) flash memory device stores one of four data states in each memory cell to represent two bits $b_0b_1$, as shown in FIG. 4A. For example, bits "11" are represented by a first threshold voltage $V_{t1}$ that is lower than a lowest reference voltage $V_{R1}$. Data bits "10" are represented by a second threshold voltage $V_{t2}$ that is higher than the lowest reference voltage $V_{R1}$ and lower than an intermediate reference voltage $V_{R2}$. Data bits "00" are represented by a third threshold voltage $V_{t3}$ that is higher than the intermediate reference voltage $V_{R2}$ and lower than a highest reference voltage $V_{R3}$. Data bits "01" are represented by a fourth threshold voltage $V_{t4}$ that is higher than the highest reference voltage $V_{R3}$. When writing two data bits on a memory cell, the threshold voltage of the memory cell is programmed to have one of the four threshold voltage $V_{t1}$-$V_{t4}$, depending on the value of the data bits. When reading data from a memory cell, the threshold voltage of the memory cell may be determined in reference to the reference voltages $V_{R1}$-$V_{R3}$. In FIG. 4A, two bits "11," "10," "00," and "01" can represent digits 0, 1, 2, 3, respectively.

Figure 4B:
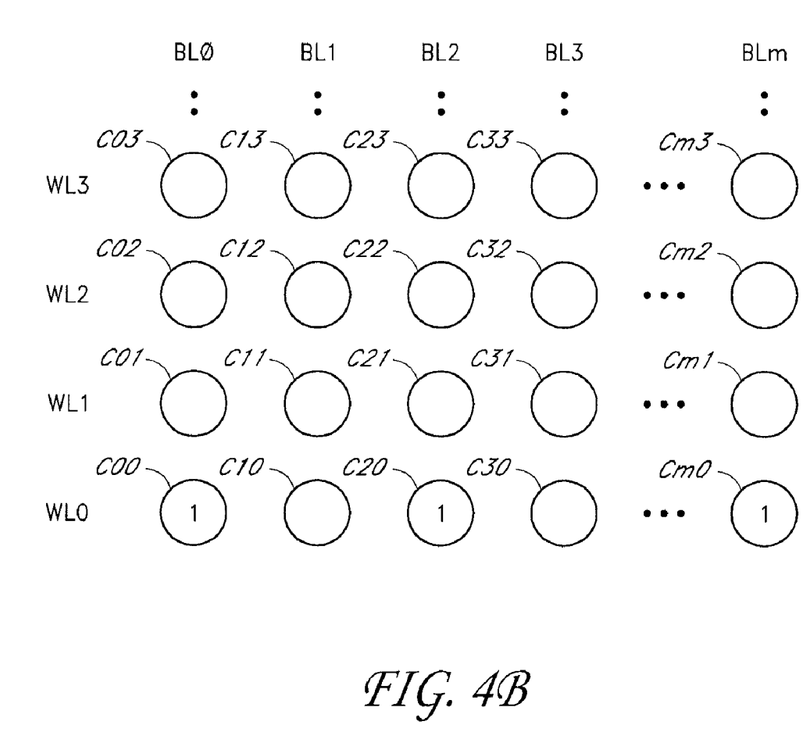
FIGS. 4B-4D are schematic diagrams illustrating another example data pattern that can cause errors in memory cells.
Figure 4C:
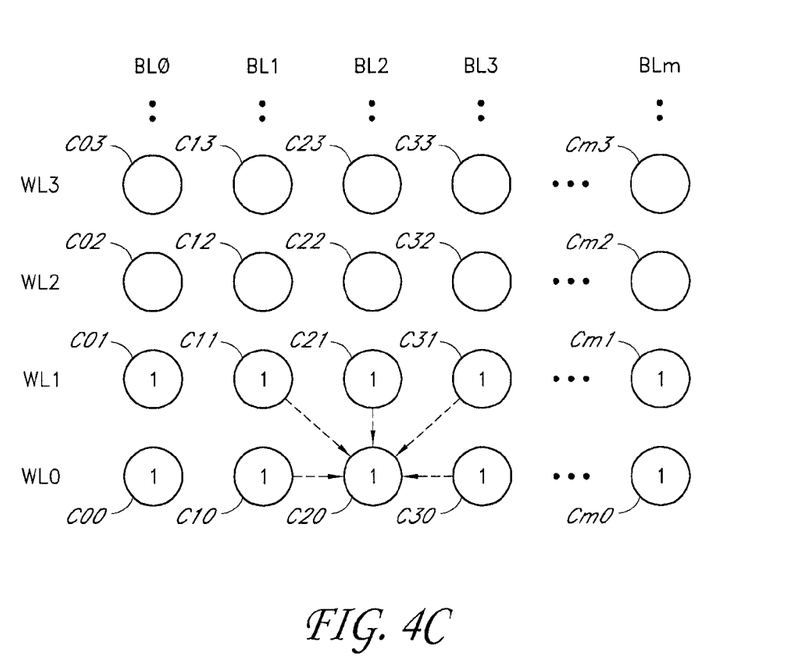
Figure 4D:
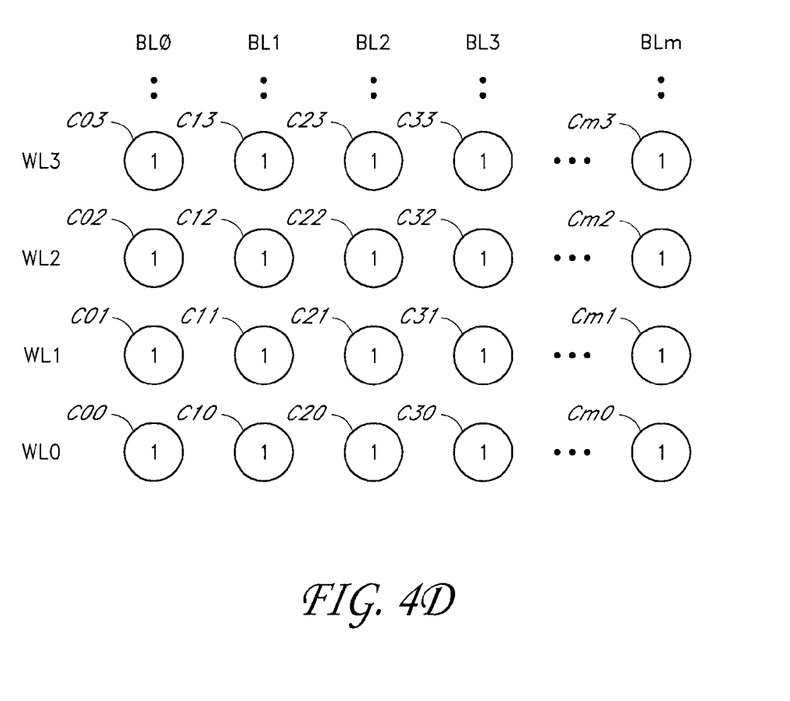

FIGS. 4B-4D illustrate a process of writing an example repeating data pattern for a multi-level cell (MLC) flash memory device. Circles represent memory cells, and numbers in the circles indicate a data digit (one of 0, 1, 2, or 3 represented by the two bits $b_0$, $b_1$ in FIG. 4A) stored in the memory cells. The memory cells are arranged in a matrix form. A row of memory cells are those memory cells coupled to a word line WL0-WLn, and a column of memory cells are those memory cells coupled to a bit line BL0-BLm.

In the illustrated example, a data pattern is written page by page, where each page includes every other memory cell on a word line. A page including a pattern of 1, 1, 1, . . . , 1 can be written on memory cells C00, C20, . . . at even-numbered bit lines BL0, BL2, . . . and the first word line WL0, as shown in FIG. 4B. Another page including the same pattern of 1, 1, 1, . . . , 1 can be written on memory cells C10, C30, . . . , Cm0 at odd-numbered bit lines BL1, BL3, . . . , BLm and the first word line WL0. In the same manner, pages including the same pattern can also be written on memory cells on a second word line WL1 immediately above the first word line WL0, as shown in FIG. 4C.

In this example, a data digit "1" is written on a memory cell C20, and then the same data digits are written on the neighboring memory cells C10, C11, C21, C31, and C30 later. In such an instance, the memory cell C20 may experience interference, such as floating gate coupling, from the neighboring memory cells C10, C11, C21, C31, and C30. The neighboring memory cells C10, C11, C21, C31, and C30, which have the same data digits as one another, may affect the threshold voltage of memory cell C20 in a concerted manner, resulting in an error in the data digit stored in the memory cell C20. In this way, a repeating pattern of 1's shown in FIG. 4D can cause errors in data digits stored in the memory cells. Such a data pattern having the same data digits in some neighboring memory cells in a memory block may be referred to as a solid pattern.

In addition to the data patterns described above, a skilled artisan will appreciate that there are various other repeating data patterns that can cause interference between memory cells, which results in errors in data digits stored in memory cells. In certain instances, such repeating data patterns can be intentionally provided to the memory cells when, for example, testing the memory device. Therefore, there is a need for a scheme to reduce or eliminate such data pattern-dependent interference.

In one embodiment, a NAND flash memory device includes a memory block including a plurality of word lines, a plurality of bit lines, and a plurality of memory cells at the intersections of the word lines and bit lines. Data (referred to herein as "original" data) can be sequentially provided to the NAND flash memory device to be written on at least some of the memory cells in a memory block. The original data is changed, using a data randomizer such that a pattern of the data as stored in the memory block is different. The changed data are stored in the memory block. Information on the change of the data is stored in the NAND flash memory device, and is used when reading the data from the memory block.

Figure 5:
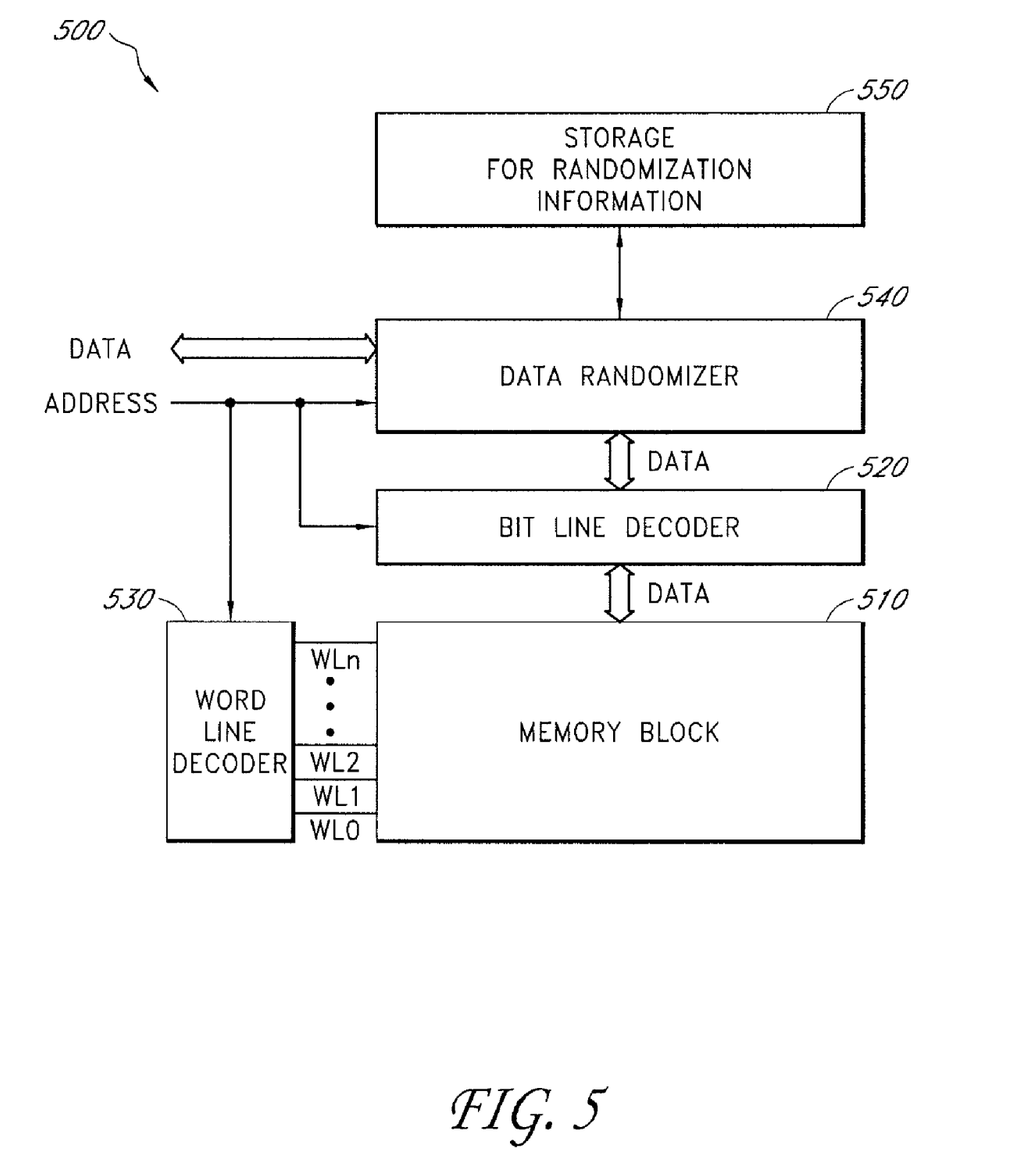
FIG. 5 is a schematic block diagram of a NAND flash memory device including a data randomizer according to one embodiment.

Referring to FIG. 5, one embodiment of a NAND flash memory including a data randomizer will be described below. The illustrated NAND flash memory 500 includes a memory block 510, a bit line decoder 520, a word line decoder 530, a data randomizer 540, and storage 550 for randomization information. Although not illustrated, the NAND flash memory 500 can include other memory blocks and other components for its operation.

The memory block 510 includes a plurality of memory cells arranged in a matrix form. The memory block 510 also includes word lines and bit lines. The details of the memory cells, the word lines, and bit lines can be as described above in connection with FIGS. 2A-2C. In one embodiment, the memory cells may be single-level cells (SLCs). In other embodiments, the memory cells may be multi-level cells (MLCs).

The bit line decoder 520 is configured to select bit lines according to an address provided by an external device (not shown). The external device may be any type of electronic device that needs to store data in the NAND flash memory device. The bit line decoder 520 receives the address from the external device, and changed data from the data randomizer 540. The bit line decoder 520 provides the changed data to the memory block according to the address.

The word line decoder 530 is configured to select word lines according to the address provided by the external device. The word line decoder 530 receives the address from the external device, and selects a word line according to the address.

The data randomizer 540 is configured to change original data to changed data, during a write operation, such that it is stored in a pattern that is different than a pattern in which the original data would have been stored, and to restore the changed data to the original data during a read operation. The data randomizer 540 receives original data and addresses of memory cells from the external device during a write operation. The data randomizer 540 changes the original data in a random manner or in a pseudo random manner to changed data, and stores information associated with the change (hereinafter, "randomization information) in the storage 550 during the write operation. In certain embodiments, the data randomizer 540 may use information previously stored in the storage 550 to change the data.

The data randomizer 540 receives addresses of memory cells from the external device and changed data from the memory block 510 during a read operation. The data randomizer 540 uses the randomization information for restoring the changed data to the original data during the read operation.

The storage 550 for randomization information serves to store the randomization information for data stored in the memory block 510. In one embodiment, the storage 550 can be one or more of the other memory blocks in the NAND flash memory device 500 or portions thereof. In other embodiments, the storage 550 can be one or more rewritable nonvolatile memories in the NAND flash memory device 500. A skilled artisan will appreciate that various types of storage devices can be used for the storage 550.

Figure 6A:
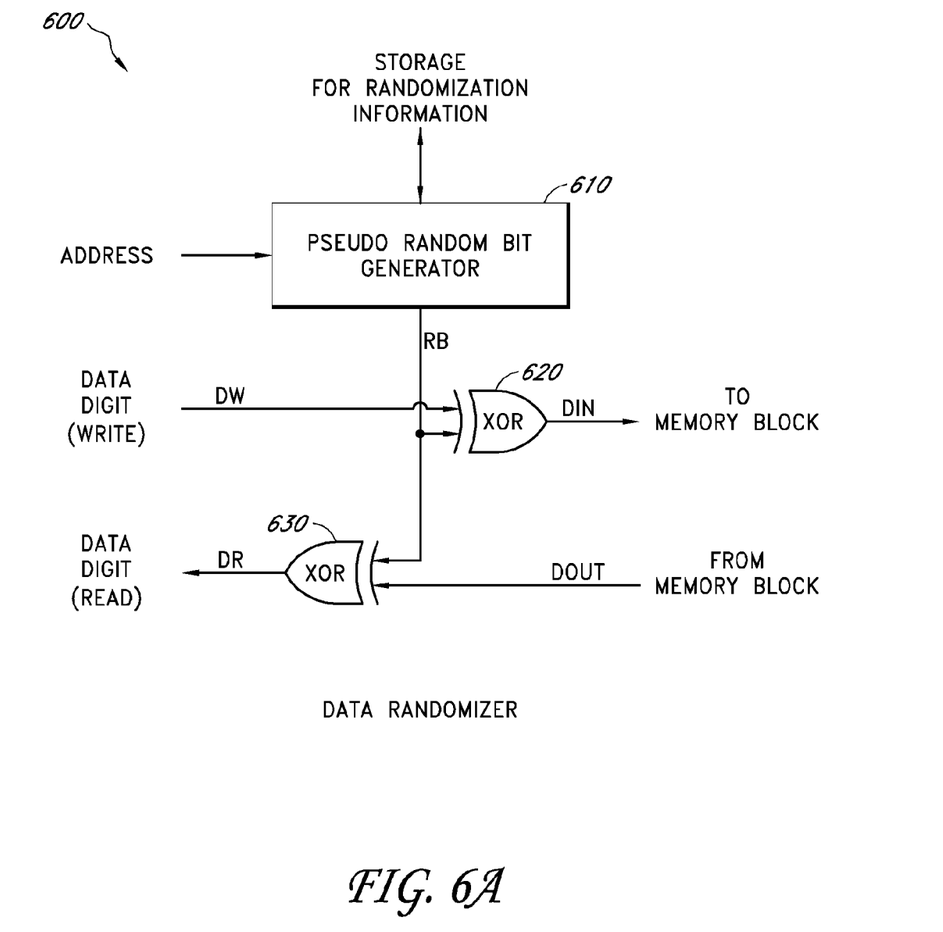
FIG. 6A is a schematic block diagram of one embodiment of the data randomizer of FIG. 5.

Referring to FIGS. 5 and 6A, one embodiment of the data randomizer of FIG. 5 will be described below in detail. The illustrated data randomizer 600 of FIG. 6A includes a pseudo random bit (PRB) generator 610, a first XOR gate 620, and a second XOR gate 630. In the illustrated embodiment, only one pair of XOR gates 620, 630 are shown for processing data. However, a skilled artisan will understood that a data randomizer 600 can include more pairs of XOR gates. In one embodiment in which data is provided simultaneously as a byte (that is, eight bits), the data randomizer 600 can include a pair of XOR gates for each of the eight bits (that is, eight pairs of XOR gates).

During a write operation, the pseudo random bit generator 610 receives addresses indicating memory cells where data are to be stored, and generates a random bit for each of the addresses. The pseudo random bit generator 610 is deterministic in its output, that is, the pseudo random bit generator 610 generates a unique output of either "0" or "1" for each of the addresses. For example, whenever the pseudo random bit generator 610 receives a specific address "x," it always generates "1." Likewise, whenever the pseudo random bit generator 610 receives another specific address "y," it always generates "0."

Data are provided to the NAND flash memory device 500 along with a unique address. Thus, each unique address, when passed through the pseudo random bit generator 610, generates a unique value of either "0" or "1." This unique value can be used for changing the original data, as will be described in the following.

The pseudo random bit generator 610 provides the random bit to one of the inputs of the first XOR gate 620. The pseudo random bit generator 610 also stores the random bit in the storage 550 (FIG. 5).

During a read operation, the pseudo random bit generator 610 receives addresses indicating memory cells from which data are to be read, and retrieves a random bit from the storage 550 for each of the addresses. The pseudo random bit generator 610 provides the random bit to one of the inputs of the second XOR gate 630.

During a write operation, the first XOR gate 620 receives a random bit from the pseudo random bit generator 610 and original data DW to be written on a memory cell in the memory block 510 (FIG. 5). The memory cell is indicated by an address that the pseudo random bit generator 610 has received. The first XOR gate 620 performs an XOR operation on the random bit and the data DW, and provides the resulting output DIN as changed data to be actually written on the memory cell in the memory block 510. In certain embodiments using a multi-level cell flash memory device, the resulting output DIN may be further processed such that two data bits are stored in a single memory cell.

During a read operation, the second XOR gate 630 receives a random bit from the pseudo random bit generator 610 and changed data DOUT read from a memory cell in the memory block 510. The memory cell is indicated by an address that the pseudo random bit generator 610 has received. The second XOR gate 630 performs an XOR operation on the data DOUT and the random bit, and provides the resulting output DR as original data to be actually read out to the external device (not shown).

Although not illustrated, the resulting output DIN can be temporarily stored in a buffer (not shown) before being written on the memory block 510. Likewise, the data DOUT read from the memory block 510 can be stored in the buffer after it is read from the memory block 510, and can be sequentially provided to the data randomizer 600.

Figure 6B:
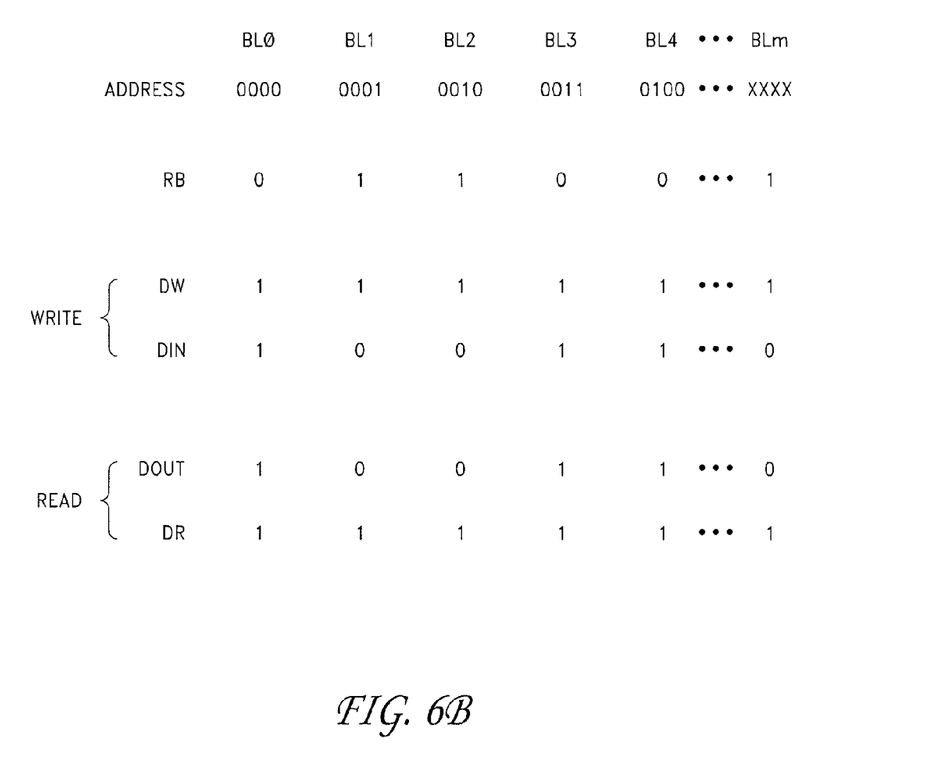
FIG. 6B illustrates the operation of the data randomizer of FIG. 6A.

Referring to FIGS. 5, 6A, and 6B, the operation of the data randomizer 600 of FIG. 6A will be described below. During a write operation, a sequence of addresses may be provided to the NAND flash memory device 500 from an external device. For example, in FIG. 6B, the addresses are, in sequence, 0000, 0001, 0010, 0011, 0100, . . . , xxxx that indicate memory cells on a word line.

Original data are also provided to the NAND flash memory device 500 from the external device. Data bits DW to be written on memory cells indicated by the addresses may have a repeating pattern. For example, the data bits can be, for example, in sequence, 1, 1, 1, 1, 1, . . . , 1. Random bits RB generated by the pseudo-random bit generator 610 can be, for example, in sequence, 0, 1, 1, 0, 0, . . . , 1.

The first XOR gate 620 performs an XOR operation on data DW and random bit RB (see Table 1 below).

TABLE 1

| Data digit (DW) | Random bit (RB) | DIN |
|---|---|---|
| 0 | 0 | 0 |
| 0 | 1 | 1 |
| 1 | 0 | 1 |
| 1 | 1 | 0 |

The results are, in sequence, 1, 0, 0, 1, 1, ..., 0. Thus, the data digits DIN actually written on the word line of the memory block will be in a randomized pattern, not the original repeating pattern.

During a read operation, a sequence of addresses of memory cells in the memory block 510 may be provided to the NAND flash memory device 500 from the external device. The pseudo-random bit generator 610 retrieves a sequence of random bits associated with the addresses. For example, in the illustrated example, a sequence of random bits RB, 0, 1, 1, 0, 0, ..., 1, are retrieved from the storage 550 for the addresses 0000, 0001, 0010, 0011, 0100, ..., xxxx. Changed data DOUT are read from the memory cells at the addresses in the memory block 510. In the illustrated example, the data bits DOUT are 1, 0, 0, 1, 1, ..., 0 that have been stored during the write operation described above.

The second XOR gate 630 performs an XOR operation on DOUT and RB (see Table 2 below).

TABLE 2

| Data digit (DOUT) | Random bit (RB) | DR |
|---|---|---|
| 0 | 0 | 0 |
| 0 | 1 | 1 |
| 1 | 0 | 1 |
| 1 | 1 | 0 |

The results are, in sequence, 1, 1, 1, 1, 1, ..., 1. Thus, the data DR actually read out from the NAND flash memory device 500 correspond to the original data. The data DR are provided to the external device. Thus, the data randomization scheme described above can be transparent to an external device.

During an erase operation, all the memory cells in the memory block 510 are erased to the same state. Thus, the data randomizer 540 may be disabled during an erase operation.

In the methods of the embodiments described above, original data are changed to changed data, which can avoid storing a repeating data pattern on a memory block in a NAND flash memory device. By avoiding writing a repeating data pattern on a memory block, interference (for example, floating gate coupling) associated with such a repeating data pattern can be reduced or eliminated.

The embodiments above are described in the context of NAND flash memory devices. The embodiments can also be adapted for NOR flash memory devices and other types of memory devices (for example, EPROM, EEPROM, etc.) having similar interference issues associated with a data pattern written on their memory cells. In addition, the embodiments above can be adapted for any other types of solid state memory devices that have similar problems described above due to their write methods and inherent susceptibility of certain memory cells to interference from neighboring memory cells.

A flash memory device according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a portable memory device (for example, USB drive), a solid state disk, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, a game device, etc. Further, the electronic device can include unfinished products.

One embodiment is a memory device including: a memory block including a plurality of memory cells; and a data randomizer configured to randomly or pseudo-randomly change original data to be stored in the memory block to changed data. The original data is changed such that a pattern of data as stored in the memory block is different than what it would have been if the original data had been stored in the memory block during a write operation.

Another embodiment is an apparatus including: a memory block including a plurality of memory cells; and a data randomizer configured to receive original data representing a first set of digits in a first pattern, and to randomly or pseudo-randomly change some, but not all, of the digits represented by the original data, thereby generating changed data representing a second set of digits in a second pattern that is different from the first pattern during a write operation. The apparatus is configured to store the changed data in the memory block.

Yet another embodiment is a method of operating a memory device. The method includes: receiving original data; changing the original data randomly or pseudo-randomly to changed data; and storing the changed data. The original data is changed such that a pattern of data as stored in the memory block is different than what it would have been if the original data had been stored in the memory block.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:

1. A memory device comprising:
   a memory block including a plurality of memory cells;
   a data randomizer configured to pseudo-randomly change original data to be stored in the memory block to changed data, wherein the original data is changed such that a pattern of data as stored in the memory block is different than what the pattern would have been if the original data had been stored in the memory block during a write operation, and wherein the data randomizer comprises a random bit generator configured to receive an address indicative of at least one of the plurality of memory cells, and to deterministically generate a random bit for the address during a write operation; and
   a storage configured to store the random bit for the address, wherein the data randomizer is further configured to retrieve the random bit for the address stored in the storage during a read operation subsequent to the write operation and restore the changed data back to the original data based on the stored random bit during the read operation.

2. The device of claim 1, wherein the data randomizer further comprises a first logic gate configured to perform an XOR operation on a random bit generated for one of the addresses and the original data to be stored in a memory cell indicated by the one of the addresses during the write operation.

3. The device of claim 1, wherein the data randomizer further comprises a second logic gate configured to perform an XOR operation on a random bit generated for one of the addresses and the changed data read from a memory cell indicated by the one of the addresses during the read operation.

4. The device of claim 1, further comprising another memory block, wherein the storage is the other memory block.

5. The device of claim 1, further comprising a read-only memory (ROM), wherein the storage is the ROM.

6. The device of claim 1, wherein the data randomizer is configured to be disabled during an erase operation.

7. The device of claim 1, wherein the memory cells are single-level cells (SLCs).

8. The device of claim 1, wherein the memory cells are multi-level cells (MLCs).

9. The device of claim 1, wherein the memory device comprises a NAND or NOR flash memory device.

10. The device of claim 1, further comprising a bit line decoder configured to select bit lines of the memory block according to the addresses, wherein the bit line decoder is further configured to receive the changed data from the data randomizer, and to provide the changed data to the memory block.

11. An apparatus comprising:
a memory block including a plurality of memory cells;
a storage; and
a data randomizer configured to receive original data representing a first set of digits in a first pattern, and to pseudo-randomly change some, but not all, of the digits represented by the original data based on addresses indicative of at least some of the plurality of memory cells on which the first set of digits are to be stored, thereby generating changed data representing a second set of digits in a second pattern that is different from the first pattern during a write operation, wherein the data randomizer is configured to store randomization information in the storage during a first operation, and wherein the data randomizer is configured to retrieve the randomization information from the storage during a later operation,
wherein the apparatus is configured to store the changed data in the memory block.

12. The apparatus of claim 11, wherein the data randomizer is further configured to restore the changed data to the original data during a read operation, and wherein the read operation is the later operation.

13. The apparatus of claim 11, wherein the data randomizer is further configured to generate a random bit for a respective one of the addresses, wherein the randomization information comprises the random bit, wherein the data randomizer is further configured to perform an XOR operation on a random bit generated for one of the addresses and a respective one of the digits represented by the original data, and wherein the respective one of the digits is to be stored in a memory cell indicated by the one of the addresses during the write operation.

14. The apparatus of claim 11, wherein the apparatus comprises a solid-state memory device.

15. The apparatus of claim 11, further comprising a bit line decoder configured to select bit lines of the memory block according to the addresses, wherein the bit line decoder is further configured to receive the changed data from the data randomizer, and to provide the changed data to the memory block.

16. A method of operating a memory device, the method comprising:
receiving original data;
generating a random bit using address data;
changing the original data pseudo-randomly to changed data based on the random bit; and
storing the changed data to an address in a memory block corresponding to the address data, wherein the original data is changed such that a pattern of data as stored in the memory block is different than what the pattern would have been if the original data had been stored in the memory block.

17. The method of claim 16, wherein changing the data further comprises performing an XOR operation on the random bit, thereby generating the changed data.

18. The method of claim 16, further comprising:
storing the random bit; and
after storing the changed data, retrieving the stored random bit.

19. The method of claim 16, further comprising disabling the changing during an erase operation.

20. The method of claim 18, further comprising, after storing the changed data:
reading the changed data from the memory cell indicated by the one of the addresses;
performing an XOR operation on the stored random bit, thereby restoring the original data; and
outputting the restored original data.

* * * * *